United States Patent
Tapily et al.

(10) Patent No.: US 10,847,424 B2
(45) Date of Patent: Nov. 24, 2020

(54) METHOD FOR FORMING A NANOWIRE DEVICE

(71) Applicant: Tokyo Electron Limited, Tokyo (JP)

(72) Inventors: Kandabara Tapily, Albany, NY (US);
Jeffrey Smith, Albany, NY (US);
Gerrit Leusink, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/449,118

(22) Filed: Jun. 21, 2019

(65) Prior Publication Data

US 2019/0393097 A1     Dec. 26, 2019

Related U.S. Application Data

(60) Provisional application No. 62/688,906, filed on Jun. 22, 2018, provisional application No. 62/690,331, filed on Jun. 26, 2018.

(51) Int. Cl.
| | |
|---|---|
| *H01L 21/8234* | (2006.01) |
| *H01L 29/06* | (2006.01) |
| *H01L 21/28* | (2006.01) |
| *H01L 29/423* | (2006.01) |

(52) U.S. Cl.
CPC ........ *H01L 21/823462* (2013.01); *H01L 21/28158* (2013.01); *H01L 29/0669* (2013.01); *H01L 29/42364* (2013.01)

(58) Field of Classification Search
None
See application file for complete search history.

(56) References Cited

U.S. PATENT DOCUMENTS

| | | | |
|---|---|---|---|
| 2010/0320545 A1* | 12/2010 | Jagannathan | ... H01L 21/823462 257/392 |
| 2017/0104058 A1* | 4/2017 | Borg | ................. H01L 21/02549 |
| 2017/0117389 A1 | 4/2017 | Cheng et al. | |
| 2017/0162714 A1 | 6/2017 | Zhu | |
| 2017/0194357 A1 | 7/2017 | Balakrishnan et al. | |
| 2017/0229538 A1 | 8/2017 | Cheng et al. | |
| 2018/0226490 A1* | 8/2018 | Le | ....................... H01L 29/0673 |
| 2019/0157101 A1* | 5/2019 | Kaufman-Osborn | ....................... H01L 21/3105 |

FOREIGN PATENT DOCUMENTS

| | | |
|---|---|---|
| WO | 2017052644 A1 | 3/2017 |

OTHER PUBLICATIONS

Korean Intellectual Property Office, International Search Report and Written Opinion for international application No. 180767WO01, dated Oct. 11, 2019, 11 pages.

\* cited by examiner

*Primary Examiner* — Asok K Sarkar

(57) ABSTRACT

A method of forming a nanowire device includes providing a substrate containing nanowires between vertical spacers, selectively depositing a high-k film on the nanowires relative to the vertical spacers, and selectively depositing a metal-containing gate electrode layer on the high-k film relative to the vertical spacers. The method can further include selectively depositing a dielectric material on the vertical spacers prior to selectively depositing the high-k film, where the dielectric material has a lower dielectric constant than the high-k film.

20 Claims, 5 Drawing Sheets

METHOD FOR FORMING A NANOWIRE DEVICE

CROSS-REFERENCE TO RELATED APPLICATIONS

This application claims priority to U.S. Provisional Patent Application No. 62/688,906, entitled, "Method for Forming an Advanced Gate Stack for 3D Integration," filed Jun. 22, 2018; the disclosure of which is expressly incorporated herein, in its entirety, by reference. This application claims priority to U.S. Provisional Patent Application No. 62/690,331, entitled, "Method for Forming an Advanced Gate Stack for 3D Integration," filed Jun. 26, 2018; the disclosure of which is expressly incorporated herein, in its entirety, by reference.

FIELD OF INVENTION

The present invention relates to the field of semiconductor manufacturing and semiconductor devices, and more particularly to a method for forming nanowire devices for an integrated circuit.

BACKGROUND OF THE INVENTION

The semiconductor industry has relied on scaling/reducing device feature size in order to boost performance and increase device density. The continued device performance improvement due to scaling has seen the introduction of unique technologies such as semiconductor on insulator (e.g., silicon on insulator (SOI) and germanium on insulator (GeOI), stressor such as SiGe, SiC to improve mobility at the 90nm node, epitaxial regrowth of source and drain (raised source and drain), high-k metal gate (HKMG) at the 45 nm node, and 3D structures such as FinFETs and trigates at the 22 nm node.

However, maintaining the device performance and good short channel control is quite challenging beyond the 14 nm technology node. New materials (e.g., III-V semiconductors, Ge, SiGe, graphene, $MoS_2$, $WS_2$, $MoSe_2$, and $WS_2$) and new integration schemes (e.g., nanowires) are needed. Nanowire devices offer scaling of feature sizes, good short channel control, and enhancement in the device mobility, hence enhancement in device speed.

SUMMARY OF THE INVENTION

A method is provided for forming a nanowire device. The method includes providing a substrate containing nanowires between vertical spacers, selectively depositing a high-k film on the nanowires relative to the vertical spacers, and selectively depositing a metal-containing gate electrode layer on the high-k film relative to the vertical spacers. The method can further include selectively depositing a dielectric material on the vertical spacers prior to selectively depositing the high-k film, wherein the dielectric material has a lower dielectric constant than the high-k film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1A:
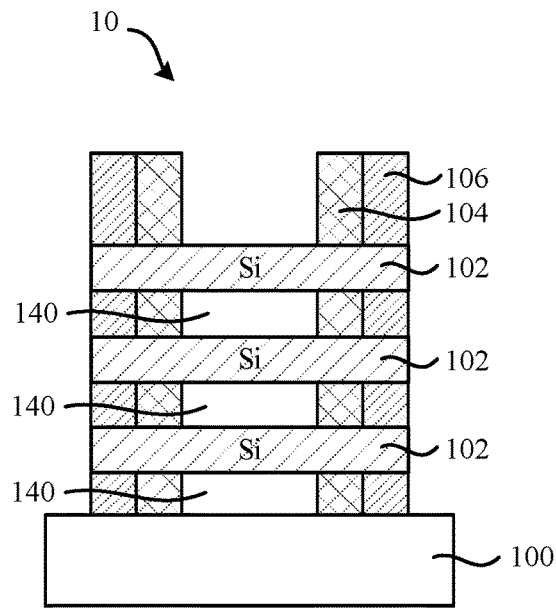
FIGS. 1A-1J schematically show through cross-sectional views formation of partially manufactured nanowire devices according to an embodiment of the invention.
Figure 1B:
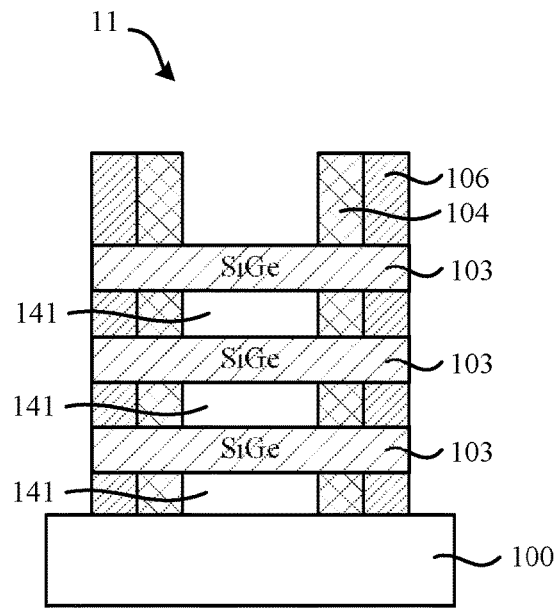

FIGS. 1A-1J schematically show through cross-sectional views formation of partially manufactured nanowire devices according to an embodiment of the invention. FIGS. 1A and 1B schematically shows a cross-sectional view of simplified nanowire structures 10/11 formed on a substrate 100, where the nanowire structures 10/11 contain vertical spacers 104/106, and nanowires 102/103 that are vertically stacked between the vertical spacers 104/106. According to another embodiment, the nanowires 102/103 may be in the same vertical plane. The substrate 100 may, for example, be 200 mm Si wafer, a 300 mm Si wafer, or larger Si wafer. The vertical spacers 104 can contain a dielectric material with a dielectric constant (k) less than about 7, for example a SiCOH material with a dielectric constant (k) between about 2.8 and 3.5. In another example, the vertical spacers 104 can include airgap spacers. In one example, the vertical spacers 106 can contain a $SiO_2$ material. Only three nanowires 102/103 are shown in the nanowire structures 10/11, but embodiments of the invention can include any number of nanowires.

The nanowires 102 can contain epitaxial Si material and the nanowire structure 10 can form a N-type Metal Oxide Semiconductor (NMOS) device on the substrate 100. Further, the nanowires 103 can contain epitaxial SiGe material and the nanowire structure 11 can form a P-type Metal Oxide Semiconductor (PMOS) device on the substrate 100. In another example, the nanowires 102/103 may be integrated into a vertically offset nanowire structure that forms both a NMOS device and a PMOS device. The partially manufactured nanowire structures 10/11 may be formed by removing a dummy gate (not shown) above the nanowires 102/103 and removing epitaxial layers between the nanowires 102/103. The removal may be performed using a selective isotropic etch process that forms openings 140/141 between the nanowires 102/103.

Figure 1C:
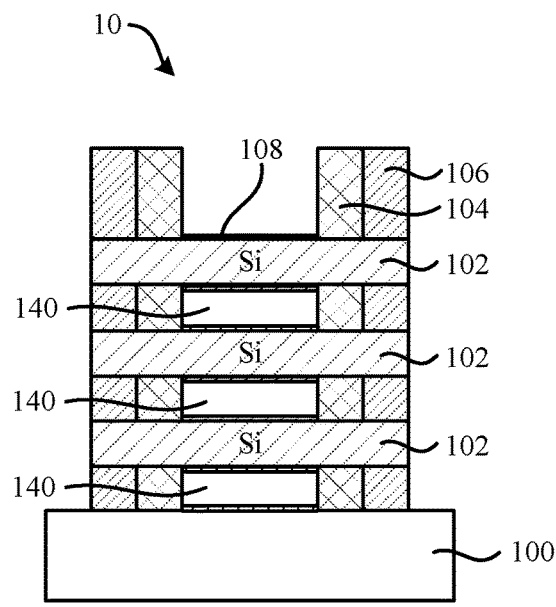
Figure 1D:
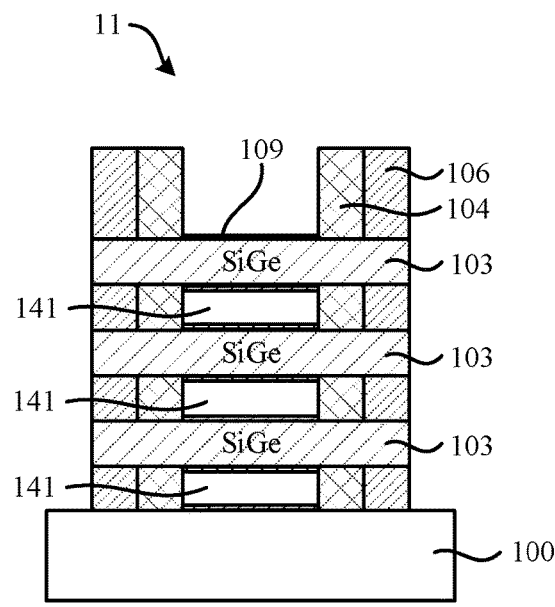

FIGS. 1C and 1D show optional processing of the nanowire structures 10/11 according to an embodiment of the invention. The processing includes exposing the nanowire structures 10/11 to an isotropic oxidizing plasma that oxidizes the surfaces of the nanowires 102/103 to form $SiO_2$ layers 108/109 on the nanowires 102/103. The exposure to the isotropic oxidizing plasma may be performed using microwave plasma excitation of a process gas containing oxygen and hydrogen. In one example, the process gas can contain $O_2$ gas and $H_2$ gas. The microwave plasma excitation may be supplied by a RLSA™ microwave plasma system available from Tokyo Electron Limited, Akasaka, Japan. Alternatively, the $SiO_2$ layers 108/109 may be formed using a high temperature and high pressure condensation heat-treating in an oxidizing atmosphere.

Figure 1E:
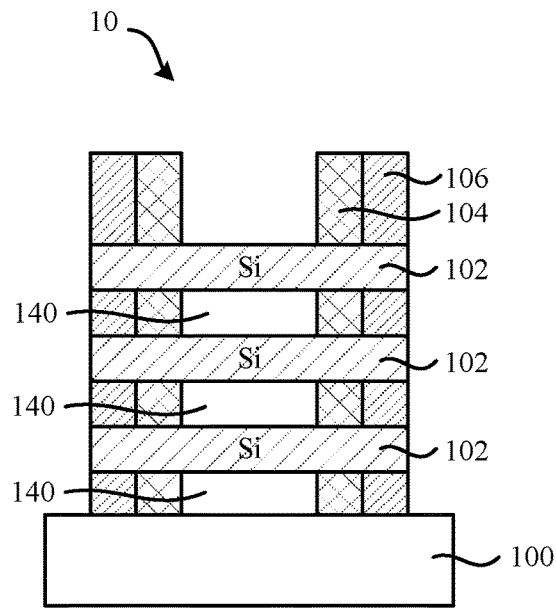
Figure 1F:
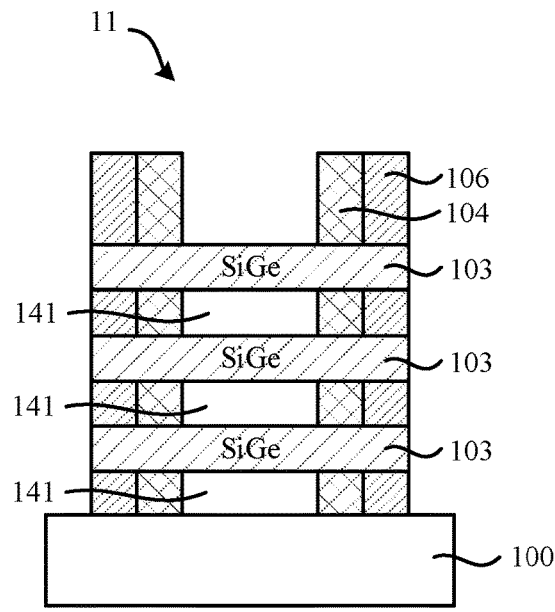

Thereafter, the $SiO_2$ layers 108/109 may be removed from the nanowires 102/103. This is schematically shown in FIGS. 1E and 1F. The formation and subsequent removal of the $SiO_2$ layers 108/109 removes defects from the surfaces of the nanowires 102/103 and also rounds the nanowires 102/103. Further, the removal of the $SiO_2$ layers 109 increases the Ge-content near the outer surface of the SiGe nanowires 103. The $SiO_2$ removal can be performed using an isotropic etching process, for example, a chemical oxide removal (COR) process. For example, the COR process may be performed by sequential or simultaneous exposures of HF gas and $NH_3$ gas, followed by a heat-treating that desorbs reaction products from the reaction of $SiO_2$ with the HF gas and the $NH_3$ gas. In one example, a COR process may be performed in a Certas WING™, a high throughput gas plasma-free chemical etching system available from Tokyo Electron Limited, Akasaka, Japan.

In one example, the $SiO_2$ removal and subsequent further processing may be integrated into a vacuum processing tool platform to avoid re-oxidation of the nanowire structures 10/11. In another example, the $SiO_2$ removal may be performed by immersing the nanowire structures 10/11 in a Dilute HF (DHF) bath and thereafter quickly placing the substrate 100 in a vacuum processing tool to avoid re-oxidation of the nanowire structures 10/11.

Figure 1G:
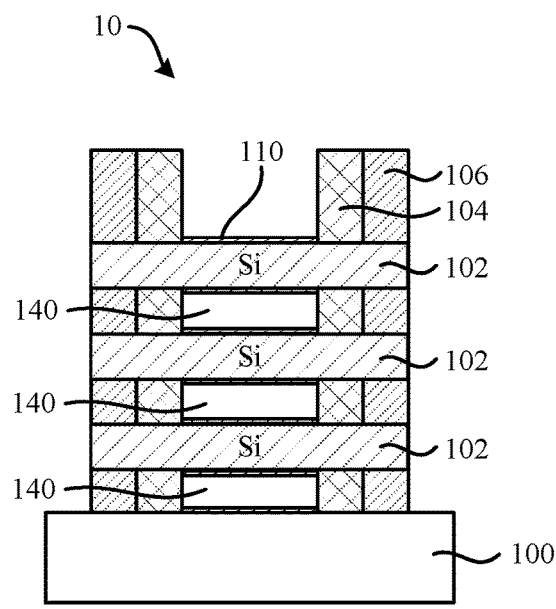
Figure 1H:
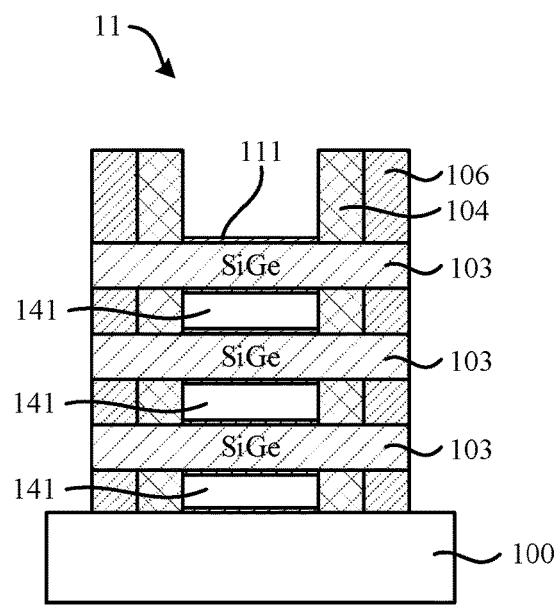

Referring now to FIGS. 1G and 1H, further processing of the nanowire structures 10/11 is schematically shown, where high-k films 110/111 are selectively deposited on the nanowires 102/103. The selective high-k deposition may be performed by blocking deposition on the vertical spacers 104. In one example, self-assembled monolayers (SAMs) may be selectively adsorbed on surfaces of the vertical spacers 104, and thereafter, the high-k films 110/111 selectively deposited on the nanowires 102/103 due to the blocking effects of the SAMs on the vertical spacers 104.

The SAMs may be selectively adsorbed on the vertical spacers 104 by treating the nanowire structures 10/11 to a reactant gas that contains a molecule that is capable of forming SAMs on a substrate. SAMs are molecular assemblies that are formed spontaneously on substrate surfaces by adsorption and are organized into more or less large ordered domains. The SAMs can include a molecule that possesses a head group, a tail group, and a functional end group, and SAMs are created by the chemisorption of head groups onto the substrate from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate.

According to one embodiment, the head group of the molecule forming the SAMs can include a thiol, a silane, or a phosphonate. Examples of silanes include molecule that include C, H, Cl, F, and Si atoms, or C, H, Cl, and Si atoms. Non-limiting examples of the molecule include perfluorodecyltrichlorosilane $(CF_3(CF_2)_7CH_2CH_2SiCl_3)$, perfluorodecanethiol $(CF_3(CF_2)_7CH_2CH_2SH)$, chlorodecyldimethylsilane $(CH_3(CH_2)_8CH_2Si(CH_3)_2Cl)$, and tertbutyl(chloro)dimethylsilane $((CH_3)_3CSi(CH_3)_2Cl))$. Other examples of silanes include alkyl silanes that include C, H, and Si atoms.

The high-k films 110/111 can include one or more metal-based oxides, for example $HfO_2$, $ZrO_2$, $TiO_2$, $Al_2O_3$, or a combination thereof. In some examples, the high-k films 110/111 may be deposited by vapor phase deposition, for example chemical vapor deposition (CVD) or atomic layer deposition (ALD). High quality high-k films may be formed by vapor phase deposition that include a plurality of alternating deposition and annealing steps. During the deposition of the high-k films 110/111, or subsequent annealing, Si may diffuse from the Si nanowires 102 into the high-k film 110 and Ge may diffuse from the SiGe nanowires into the high-k film 111.

Following deposition of the high-k films 110/111, the nanowire structures 10/11 may optionally be exposed to an isotropic oxidizing plasma that forms a thin oxidized interface layer at an interface of the high-k films 110/111 and the nanowires 102/103. The plasma processing conditions may be optimized to prevent damage to the high-k films 110/111 and only form the oxidized interface layer and not oxidize other materials in the nanowire structures 10/11. According to one embodiment, the exposure to the isotropic oxidizing plasma may be performed using microwave plasma excitation of a process gas containing oxygen and hydrogen. In one example, the process gas can contain $O_2$ gas and $H_2$ gas. The microwave plasma excitation may be supplied by a RLSA™ microwave plasma system available from Tokyo Electron Limited, Akasaka, Japan. The annealing and isotropic plasma exposure steps reduce leakage current and reduce equivalent oxide (EOT) of the high-k films 110/111.

Figure 1I:
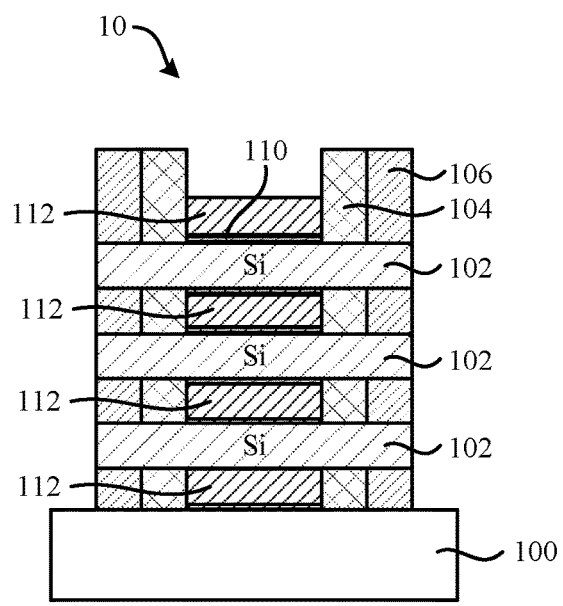
Figure 1J:
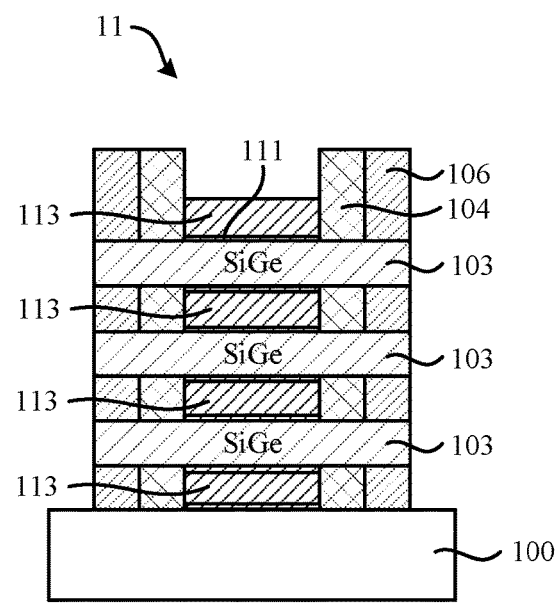

According to one embodiment, the substrate 100 in FIGS. 1G and 1H may be further processed by selectively depositing a first metal-containing gate electrode film 112 on the high-k film 110 and selectively depositing a second metal-containing gate electrode film 113 on the high-k film 111. In one example, the first and second metal-containing gate electrode films 112/113 may fully fill the remaining volume of the openings 140/141 between the nanowires 102/103. This is schematically shown in FIGS. 1I and 1J. In one example, the first metal-containing gate electrode film 112 can include TiSiN, TiAlC, Ti-rich TiN, W, $WN_x$, Mo, or Pt for a NMOS device containing the Si nanowires 102, and the second metal-containing gate electrode film 113 can include TiN, TiON, Ru, W, $WN_x$, Mo, or Pt for a PMOS device containing the SiGe nanowires 103. The Ti-rich TiN can have a Ti-content greater than conventional TiN material. The selective deposition may be carried out using conventional lithography and etching methods that include the use of a mask layer. Further, the selective deposition may further include blocking deposition of the first and second metal-containing gate electrode films 112/113 on the vertical spacers 104 using SAMs as described in reference to FIGS. 1G and 1H.

According to one embodiment, the substrate 100 in FIGS. 1G and 1H may be further processed by selectively depositing dielectric threshold voltage adjustment layers on the high-k films 110/111 prior to depositing the metal-containing gate electrode films 112/113. Alternately, the dielectric threshold voltage adjustment layers may be deposited before the high-k films 110/111. The dielectric threshold voltage adjustment layers may be used for tuning the threshold voltage (Vt) of the nanowire structures 10/11. In one example, the dielectric threshold voltage adjustment layer can include $La_2O_3$ or $Y_2O_3$ for a PMOS device containing SiGe nanowires 103 and $Al_2O_3$ for a NMOS device containing Si nanowires 102. Further, ferroelectric materials (e.g., $HfYO_x$ where Y is Zr, Al, La, Y, or Si) may be added to the high-k films 110/111 to modulate the Vt. In one example, the dielectric threshold voltage adjustment layers may be mixed with the high-k films 110/111 by interrupting deposition of the high-k films 110/111, depositing the dielectric threshold voltage adjustment layers, and then resuming the deposition of the high-k films 1110/111. In other examples, the Vt may be further modulated by varying the thickness of the dielectric threshold voltage adjustment layers, annealing the dielectric threshold voltage adjustment layers to promote diffusion into the high-k films 110/111, or both. The selective deposition of the dielectric threshold voltage adjustment layers may be carried out using conventional lithography and etching methods that include the use of a mask layer. Further, the selective deposition may further include blocking deposition of the dielectric threshold voltage adjustment layers on the vertical spacers 104 using SAMs as described in reference to FIGS. 1G and 1H. Thereafter, the nanowire structure 10 may be further processed by selectively depositing metal-containing gate electrode film 112/113 on the dielectric threshold voltage adjustment layers. According to another embodiment, the Vt of the nanowire structures 10/11 may be adjusted by doping the first and second metal-containing gate electrode films 112/113, by using different thicknesses for the first and second metal-containing gate electrode films 112/113, or both.

Figure 2:
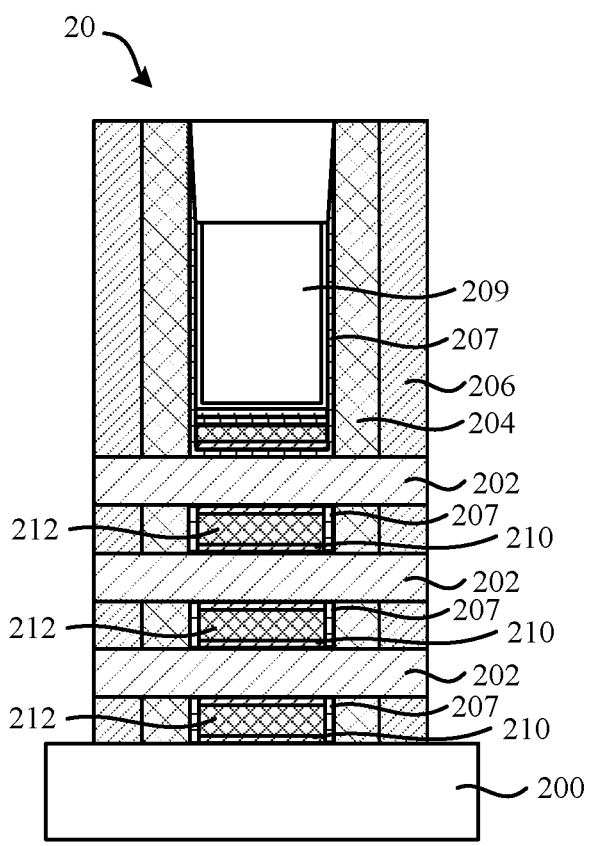
FIG. 2 schematically shows through a cross-sectional view a partially manufactured nanowire device according to an embodiment of the invention.

FIG. 2 schematically shows through a cross-sectional view a partially manufactured nanowire device according to an embodiment of the invention. The nanowire structure 20 is similar to the nanowire structure 10 in FIG. 1I and includes vertical spacers 204/206, and nanowires 202 that are vertically stacked between the vertical spacers 204/206. The vertical spacers 204 can contain a dielectric material, for example a SiCOH material. Only three nanowires 202 are shown in the nanowire structure 20, but embodiments of the invention can include any number of nanowires. The nanowires 202 can contain epitaxial Si material and the nanowire structure 20 can form a NMOS device on the substrate 200. Alternatively, the nanowires 202 can contain epitaxial SiGe material and the nanowire structure 20 can form PMOS device on the substrate 200.

The nanowire structure 20 further includes a dielectric film 207 that is selectively deposited on the vertical spacers 204, a high-k film 210 on the nanowires 202, a metal-containing gate electrode film 212 on the high-k film 210, and a metal gate 209. The selective deposition of the dielectric film 207 may be performed at any time during the manufacturing process prior to deposition of the high-k film 210. The dielectric film 207 (e.g., $SiO_x$, where $x \leq 2$) has a lower dielectric constant (k) than the high-k film 210, and this allows for controlling (lowering) the gate-to-drain capacitance of the nanowire structure 20. This is in contrast to the nanowire structure 10 in FIG. 1I, where such a dielectric film is absent and the high-k film 110 and the first metal-containing gate electrode film 112 are selectively deposited around the nanowires 102 in the openings 140, thereby resulting in higher gate-to-drain capacitance than the nanowire structure 20. This is also in contrast to nanowire structures where a high-k film is non-selectively deposited around nanowire structures and on the surfaces of the vertical spacers 204. Further, in FIG. 2, the selectively deposition of the dielectric film 207 on the vertical spacers 204 does not affect the selective deposition of the high-k film 210 on the nanowires 202 and the selective deposition of the metal-containing gate electrode film 212 on the high-k film 210.

The selective deposition of the dielectric film 207 on the vertical spacers to control the gate-to-drain capacitance can replace a need to increase a thickness of the vertical spacers 204. Increasing a thickness of the vertical spacers 204 can lead to an increase in the contacted poly pitch (CPP) of the standard cell, or can lead to a decrease in either the gate length or the contact area if the CPP is to be maintained. Both of these effects can negatively impact short channel effects and contact resistance, and can therefore be problematic for some devices. Increasing the thickness of the vertical spacers 204 also further extends the length of which the channel is passing between the source and the gate and this can lead to performance degradation, whereas positioning the dielectric film 207 selectively on the vertical spacers 204 allows for using thin vertical spacers 204 and keeping the distance between the source and the gate to a minimum.

Figure 3:
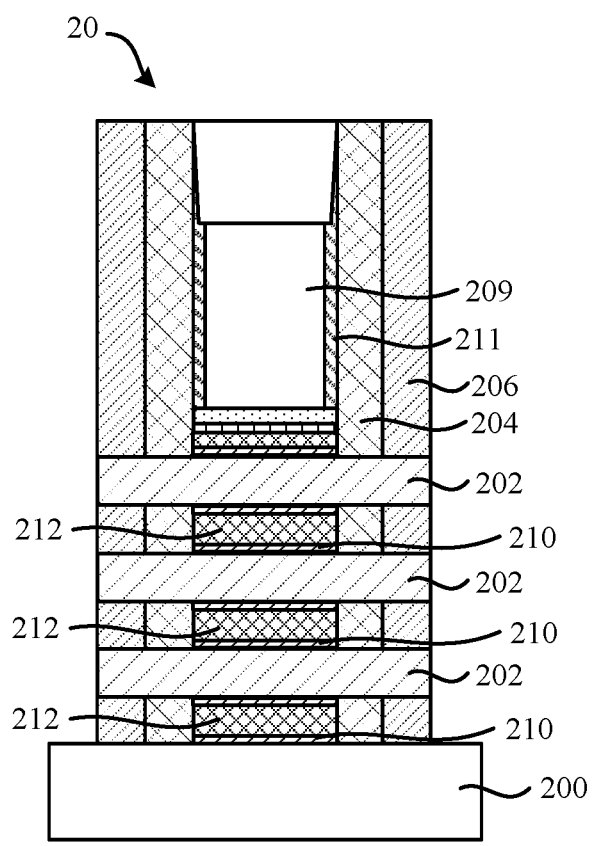
FIG. 3 schematically shows through a cross-sectional view a partially manufactured nanowire device according to an embodiment of the invention.

FIG. 3 schematically shows through a cross-sectional view a partially manufactured nanowire device according to an embodiment of the invention. The nanowire structure 30 is similar to the nanowire structure 20 in FIG. 2 but the dielectric film 207 is replaced by a dielectric film 211 that is deposited above the nanowires 202 after deposition of the high-k film 210 on the nanowires 202, and the metal-containing gate electrode film 212 on the high-k film 210. This allows for the dielectric film 211 to be thicker than the dielectric film 207 since the former does not take up space around the nanowires 202. This can significantly further reduce the gate-to-drain capacitance.

A plurality of embodiments for methods for forming a nanowire device have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of forming a nanowire device, the method comprising:
   providing a substrate containing nanowires between vertical spacers;
   selectively depositing a high-k film on the nanowires relative to the vertical spacers; and
   selectively depositing a metal-containing gate electrode layer on the high-k film relative to the vertical spacers.

2. The method of claim 1, further comprising:
   selectively depositing a dielectric material on the vertical spacers prior to selectively depositing the high-k film, wherein the dielectric material has a lower dielectric constant than the high-k film.

3. The method of claim 2, wherein selectively depositing the dielectric material on the vertical spacers includes depositing sufficient dielectric material to reduce gate-to-drain capacitance in the nanowire device.

4. The method of claim 1, further comprising:
   depositing a dielectric material on the vertical spacers above the nanowires after selectively depositing the metal-containing gate electrode layer, wherein the dielectric material has a lower dielectric constant than the high-k film.

5. The method of claim 1, further comprising:
   prior to selectively depositing the high-k film, exposing the substrate to an isotropic oxidizing plasma that forms an oxide layer on the nanowires.

6. The method of claim 5, further comprising:
   removing the oxide layer from the nanowires.

7. The method of claim 1, wherein the nanowires consist of Si, SiGe, or both Si and SiGe.

8. The method of claim 1, wherein the vertical spacers contain a SiCOH material, a dielectric material with a dielectric constant less than about 7, or airgap spacers.

9. The method of claim 1, wherein the high-k film includes $HfO_2$, $ZrO_2$, $TiO_2$, or $Al_2O_3$.

10. The method of claim 1, wherein the nanowires consist of Si and the metal-containing gate electrode layer contains TiSiN, TiAlC, Ti-rich TiN, W, $WN_x$, Mo, or Pt.

11. The method of claim 1, wherein the nanowires consist of SiGe and the metal-containing gate electrode layer contains TiN, TiON, Ru, W, $WN_x$, Mo, or Pt.

12. The method of claim 1, further comprising depositing a dielectric threshold voltage adjustment layer on the high-k film.

13. The method of claim 12, wherein the nanowires consist of Si and the dielectric threshold voltage adjustment layer includes $La_2O_3$ or $Y_2O_3$.

14. The method of claim 12, wherein the nanowires consist of SiGe and the dielectric threshold voltage adjustment layer includes $Al_2O_3$.

15. The method of claim 1, further comprising exposing the high-k film to an isotropic oxidizing plasma that forms an oxide layer at an interface of the nanowires and the high-k film.

16. The method of claim 1, wherein the selective depositing the high-k film includes blocking the high-k film deposition on the vertical spacers.

17. The method of claim 16, wherein the blocking includes forming self-assembled monolayers (SAMs) on the vertical spacers.

18. The method of claim 1, wherein the selective depositing the metal-containing gate electrode layer includes blocking the metal-containing gate electrode layer deposition on the vertical spacers.

19. The method of claim 18, wherein the blocking includes forming self-assembled monolayers (SAMs) on the vertical spacers.

20. A method of forming a nanowire device, the method comprising:
  providing a substrate containing Si, SiGe, or both Si and SiGe nanowires between vertical spacers;
  selectively depositing a dielectric material on the vertical spacers, wherein the selectively depositing the dielectric material on the vertical spacers includes depositing sufficient dielectric material to reduce gate-to-drain capacitance in the nanowire device;
  selectively depositing a high-k film on the nanowires relative to the vertical spacers by blocking the high-k film deposition on the vertical spacers, wherein the dielectric material has a lower dielectric constant than the high-k film; and
  selectively depositing a metal-containing gate electrode layer on the high-k film relative to the vertical spacers by blocking the metal-containing gate electrode layer deposition on the vertical spacers.

* * * * *